United States Patent [19]

Ohashi

[11] Patent Number: 4,958,615

[45] Date of Patent: Sep. 25, 1990

[54] SIGNAL GENERATOR FOR AN INTERNAL COMBUSTION ENGINE

[75] Inventor: Yutaka Ohashi, Himeji, Japan

[73] Assignee: Mitsubishi Denki Kabushiki Kaisha, Tokyo, Japan

[21] Appl. No.: 420,402

[22] Filed: Oct. 12, 1989

[30] Foreign Application Priority Data

Oct. 12, 1988 [JP] Japan .................. 63-254761

[51] Int. Cl.$^5$ ............................. F02P 7/07
[52] U.S. Cl. ............................. 123/617; 633/635; 633/645
[58] Field of Search ............... 123/617, 635, 634, 633, 123/645, 146.5 A

[56] References Cited

U.S. PATENT DOCUMENTS

| | | | |
|---|---|---|---|
| 4,129,107 | 12/1978 | Boyer | 123/617 |
| 4,359,978 | 11/1982 | Brammer et al. | 123/146.5 A |
| 4,365,609 | 12/1982 | Toyama et al. | 123/617 |
| 4,527,535 | 7/1985 | Ito et al. | 123/617 |
| 4,907,563 | 3/1990 | Kodama | 123/635 |

FOREIGN PATENT DOCUMENTS

| | | | |
|---|---|---|---|
| 2369744 | 5/1978 | France | |
| 2432096 | 3/1980 | France | 123/635 |
| 2512502 | 3/1983 | France | |
| 59-65571 | 4/1984 | Japan | 123/146.5 A |
| 60-222566 | 11/1985 | Japan | 123/146.5 A |

*Primary Examiner*—Andrew M. Dolinar
*Attorney, Agent, or Firm*—Sughrue, Mion, Zinn, Macpeak and Seas

[57] ABSTRACT

A signal generator has a Hall-effect sensor and a magnet which are disposed inside a distributor housing. A vane which is secured to a distributor shaft passes through a gap between the Hall-effect sensor and the magnet when the distributor shaft rotates. An ignition coil is disposed inside the distributor housing in a location such that the magnetic field which it generates combines subtractively with the magnetic field generated by the magnet in the vicinity of the Hall-effect sensor. Magnetic by-passes are disposed inside the housing to cause leakage flux from the ignition coil to by-pass the Hall-effect sensor.

5 Claims, 3 Drawing Sheets

FIG. I

SIGNAL GENERATOR FOR AN INTERNAL COMBUSTION ENGINE

BACKGROUND OF THE INVENTION

This invention relates to an improved signal generator for an internal combustion engine. More particularly, it relates to a signal generator of the type which is disposed inside a distributor together with an ignition coil.

An internal combustion engine is commonly equipped with a signal generator which generates electrical signals in synchrony with the rotation of the engine. The electrical signals are usually in the form of pulses having a rising edge and a falling edge which correspond to prescribed crankshaft angles of the engine, and thus to prescribed positions with respect to top dead center of the piston of each cylinder of the engine. These signals are input to an engine controller. Based on the timing of the signals, the controller controls the ignition timing, the fuel injection, and other aspects of engine operation which must be performed with a precise timing.

One conventional type of signal generator is disposed inside a distributor housing and detects the rotation of the distributor shaft. In this type of signal generator, a Hall-effect sensor and a magnet are disposed inside the distributor housing with a gap between the Hall-effect sensor and the magnet. The Hall-effect sensor includes a Hall element which generates an analog voltage corresponding to the strength of the magnetic field acting on it. The distributor shaft has a plurality of metallic vanes attached to it which rotate together with the distributor shaft. As the vanes rotate, they pass through the gap between the Hall-effect sensor and the magnet and change the flux which acts on the Hall element. As a result, the output voltage of the Hall element momentarily changes each time one of the vanes passes through the gap. The Hall-effect sensor generates a digital signal in the form of pulses corresponding to the changes in the output voltage of the Hall element. The distributor shaft is rotated in synchrony with the engine, so by appropriately choosing the number and the width of the vanes, the rising and falling edges of the output pulses of the Hall-effect sensor can be made to occur at prescribed rotational angles of the crankshaft of the engine and can be used for controlling the engine timing.

In some new automobiles, the ignition coil for the engine is disposed inside the distributor housing together with the signal generator. When current flows through the ignition coil, a magnetic field is generated which combines with the magnetic field generated by the magnet of the signal generator. In a conventional arrangement, the magnetic field generated by the ignition coil combines additively with the magnetic field generated by the magnet of the signal generator. The combined magnetic fields affect the output voltage of the Hall element in a manner such that the changes in the output voltage of the Hall element as the vanes rotate can not be detected. As a result, the Hall-effect sensor does not generate output pulses at the proper intervals, and the engine timing can not be properly controlled.

SUMMARY OF THE INVENTION

It is an object of the present invention to provide a signal generator for an internal combustion engine which is not adversely affected by the magnetic field generated by an ignition coil for the engine.

A signal generator for an engine in accordance with the present invention includes a Hall element and a magnet which is separated from the Hall element by a gap through which a rotating vane can pass. An ignition coil for the engine is disposed with respect to the magnet so that the magnetic field generated by the ignition coil combines subtractively with the magnetic field generated by the magnet in the vicinity of the Hall element. As a result, changes in the output voltage of the Hall element due to rotation of the vane can always be detected.

In a preferred embodiment, the Hall element is part of a Hall-effect sensor including the Hall element and a signal processing circuit for generating a digital output signal based on the analog output voltage of the Hall element.

The signal generator may also be equipped with a magnetic member which shields the Hall element from leakage magnetic flux from the ignition coil.

DESCRIPTION OF THE PREFERRED EMBODIMENT

Figure 1:
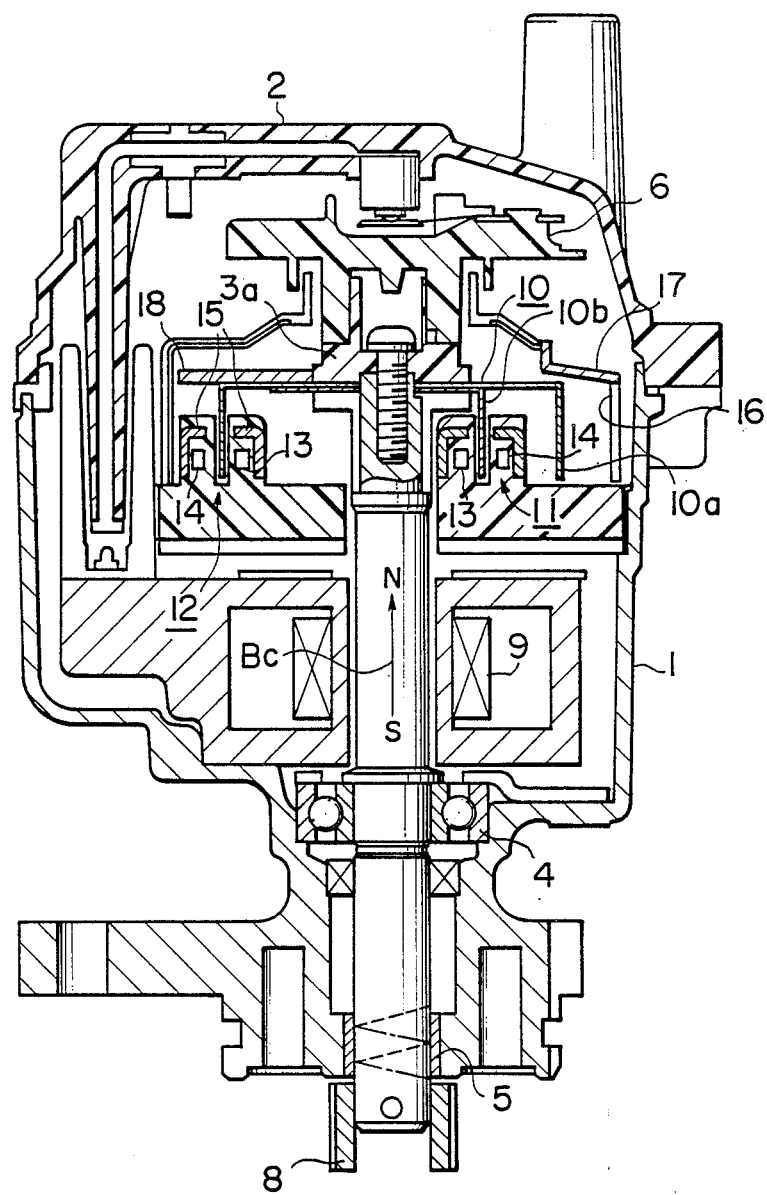
FIG. 1 is a vertical cross-sectional view of a distributor for an internal combustion engine which is equipped with a signal generator according to the present invention.

A preferred embodiment of a signal generator according to the present invention will now be described while referring to the accompanying drawings. FIG. 1 is a vertical cross-sectional view of a distributor which is equipped with this embodiment of a signal generator. As shown in this figure, the distributor has a housing which includes a base 1 and a cap 2 which is detachably mounted on the base 1. A distributor shaft 3 is rotatably supported at its lower end by bearings 4 and 5 which are supported by the base 1 of the housing. A rotor 6 is secured to the upper end of the distributor shaft 3, and a gear 8 is secured to the lower end. The gear 8 engages with the cam shaft of an unillustrated engine, whereby the gear 8 and the distributor shaft 3 are rotated in synchrony with the engine.

An ignition coil 9 is mounted inside the base 1 surrounding the distributor shaft 3. It generates a magnetic field $B_c$ having the illustrated polarity.

A cylindrical vane assembly 10 having a plurality of outer vanes 10a and a single inner vane 10b is secured to the upper end of the distributor shaft 3. The outer vanes 10a extend parallel to the axis of the distributor shaft 3 and are separated from one another in the circumferential direction of the vane assembly 10 by gaps. The number of outer vanes 10a normally equals the number of cylinders in the engine. The inner vane 10b is disposed radially inside of the outer vanes 10a.

First and second rotation sensors 11 and 12 are supported by the base I of the distributor adjacent to the distributor shaft 3. Each rotation sensor includes a magnet 13 and a Hall-effect sensor 14 which are separated from one another by a gap large enough for one of the vanes 10a or 10b to pass through. Each Hall-effect sensor 14 includes a Hall element and a signal processing circuit. The Hall element generates an analog output voltage proportional to the magnetic flux acting thereon, and the signal processing circuit generates a digital output signal based on the analog output voltage of the Hall element. The magnet 13 is close enough to the Hall-effect sensor 14 so that its magnetic field induces a voltage in the Hall element. The magnet 13 and the Hall-effect sensor 14 of each rotation sensor are supported by L-shaped iron yokes 15. The first rotation sensor 11 generates a recognition signal corresponding to a prescribed reference cylinder of the engine, and the second rotation sensor 12 generates control signals at prescribed positions with respect to top dead center of the piston of each cylinder of the engine. These signals are input to an unillustrated, conventional engine controller, which controls the engine timing.

The distributor is optionally equipped with a shield 16 which surrounds the vane assembly 10 and supports a first magnetic by-pass 17. A second magnetic by-pass 18 is disposed between a boss 3a of the distributor shaft 3 and the shield 16. The first and second magnetic by-passes 17 and 18 cause leakage flux from the ignition coil 9 to by-pass the Hall-effect sensors 14.

Figure 2:
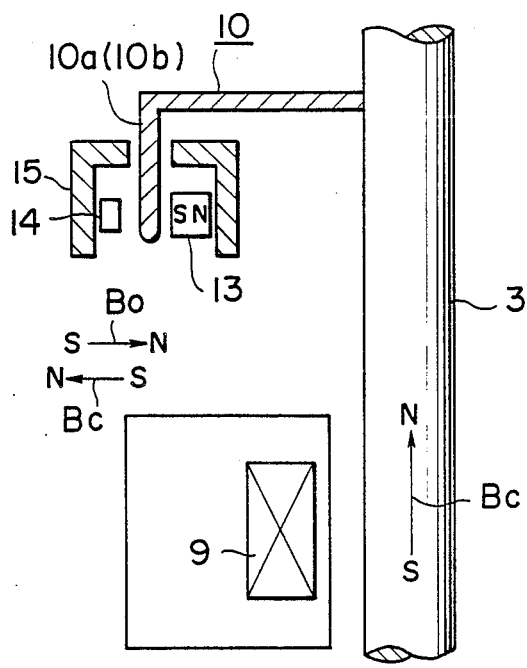
FIG. 2 is a schematic view of the signal generator of FIG. 1, showing the directions of various magnetic fields which are generated.

FIG. 2 schematically illustrates the signal generator of the present invention, showing the directions of magnetic fields which are generated around the Hall-effect sensors 14. $B_c$ indicates the magnetic field which is generated by the ignition coil 9, and $B_0$ indicates the magnetic field which is generated by the illustrated magnet 13 of one of the rotation sensors. In accordance with the present invention, the ignition coil 9 and each magnet 13 are positioned such that magnetic field $B_c$ combines subtractively with the magnetic field $B_0$ generated by each magnet 13 in the vicinity of the corresponding Hall-effect sensor 14. In other words, the ignition coil 9 and the magnets 13 are positioned such that fields $B_0$ and $B_c$ have opposite directions in the vicinity of the Hall-effects sensors 14.

The direction of the magnetic field $B_c$ which is generated by the ignition coil 9 can be determined from the direction in which its coils are wound and from the direction of the current passing therethrough. Similarly, the direction of the magnetic field $B_0$ generated by each magnet 13 is known from the orientation of its poles. Therefore, it is easy to control the directions of the magnetic fields $B_0$ and $B_c$ so that they combine subtractively in the vicinity of each of the Hall-effect sensors 14.

As mentioned previously, in a conventional signal generator, the magnetic field $B_c$ due to the ignition coil 9 combines additively with the magnetic field due to each magnet 13 in the vicinity of the corresponding Hall-effect sensor 14. There are a number of simple methods by which an existing, conventional signal generator can be altered so that the two magnetic fields $B_c$ and $B_0$ combine subtractively. One method is two reverse the orientation of each magnet 13 with respect to the conventional orientation. For example, if in a conventional arrangement the North pole of the magnet 13 faces towards the Hall-effect sensor 14, the direction of field $B_0$ can be reversed so as to be opposite that of field B by reversing the orientation of magnet 13 so that its south pole faces towards the corresponding Hall-effect sensor 14. Another method is to reverse the direction of field $B_c$ by turning the ignition coil 9 upside down. Yet another method is to reverse the direction of magnetic field $B_c$ by reversing the direction of the current passing through the ignition coil 9.

Figure 3:
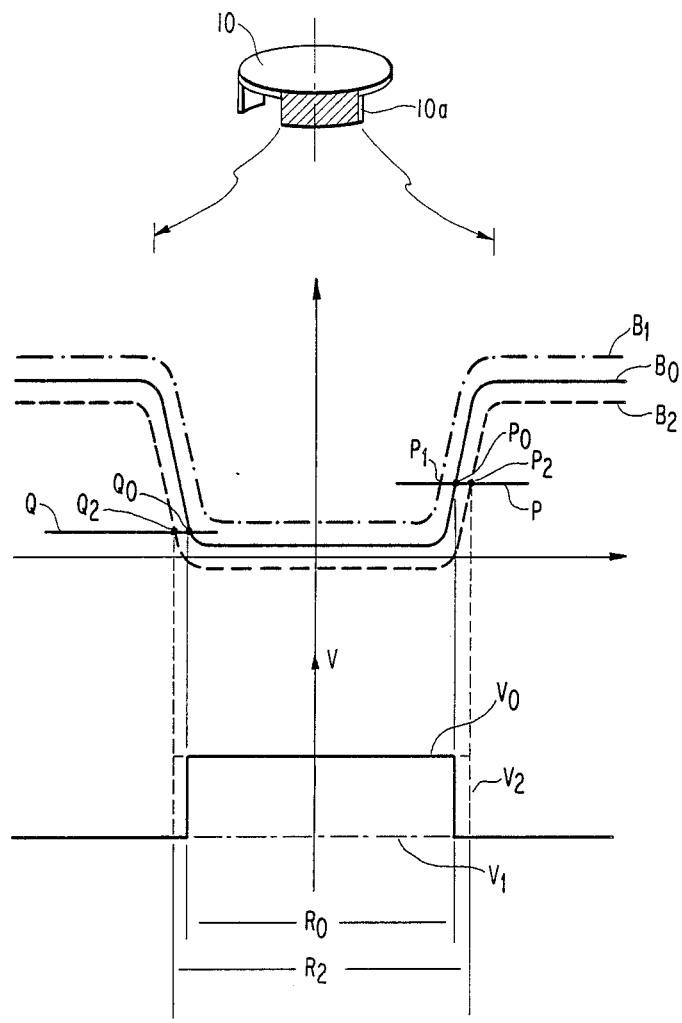
FIG. 3 is a graph of the output signals of the Hall element and the Hall-effect sensor as a function of the rotational angle of the vane assembly.

FIG. 3 illustrates the output voltage $V_B$ of the Hall element and the output voltage V of the Hall-effect sensor 14 as a function of the rotational angle $\Theta$ of the vane assembly 10 as it rotates with the distributor shaft 3. A rotational angle of 0 degrees corresponds to the position of a vane 10a when it is aligned with the centerline of the magnet 13 and the Hall-effect sensor 14. The output voltage $V_B$ of the Hall element is a maximum when there is no obstruction between the magnet 13 and the corresponding Hall-effect sensor 14. Whenever a vane 10a or 10b moves between a magnet 13 and a Hall-effect sensor 14, the magnetic field acting on the Hall element decreases, so its output voltage $V_B$ falls. In FIG. 3, the curve marked $V_{B0}$ indicates the output voltage of the Hall element when the Hall element is subjected to the magnetic field $B_0$ due only to the corresponding magnet 13 in the absence of any magnetic flux due to the ignition coil 9. $V_{B1}$ indicates the output voltage of the Hall element in a conventional signal generator when the ignition coil 9 is conducting. $V_{B2}$ indicates the output voltage of the Hall element of a signal generator according to the present invention when the ignition coil 9 is conducting.

Q and P indicate two reference voltages of the unillustrated signal processing circuit of each Hall-effect sensor 14. When the output voltage $V_b$ of the Hall element falls below the first reference voltage Q, the output signal of the Hall-effect sensor 14 changes from a low level to a high level. Conversely, when the output voltage $V_B$ of the Hall element exceeds the second reference voltage P, the output signal of the Hall-effect sensor 14 changes from a high level to a low level.

When only magnetic field $B_0$ is acting on the Hall element, its output voltage $V_B$ falls below the first reference voltage Q at point $Q_0$ and then exceeds the second reference voltage P at point $P_0$. Accordingly, the signal processing circuit of the Hall-effect sensor 14 generates an output pulse $V_0$ having a pulse width $R_0$ between points $Q_0$ and $P_0$. This output signal $V_0$ is provided to the unillustrated engine controller, which uses the signal $V_0$ to control the engine timing.

In a conventional signal generator, when the ignition coil 9 conducts, magnetic fields $B_0$ and $B_c$ combine additively, so the output voltage of the Hall element is $V_{B1}$, which is higher than voltage $V_{B0}$. This voltage $V_{B1}$ exceeds the second reference voltage P at point P1, but it never falls below the first reference voltage Q. Therefore, the signal processing circuit of the Hall-effect sensor 14 does not respond to changes in the output voltage of the Hall element, the output signal $V_1$ of the Hall-effect sensor 14 remains at a low level and no output pulse is generated. In the absence of an output pulse from the Hall-effect sensor 14, the engine controller can not properly control the engine timing.

In contrast, in the present invention, when the ignition coil 9 conducts, the magnetic field $B_0$ due to the ignition coil 9 combines subtractively with the magnetic field $B_0$ due to the magnet 13 in the vicinity of the corresponding Hall-effect sensor 14. Therefore, the output voltage $V_{B2}$ of the Hall element is lower than voltage $V_{B0}$. This voltage $V_{B2}$ falls below the first reference voltage Q at point $Q_2$ and exceeds the second reference voltage P at point $P_2$, so the signal processing circuit of the Hall-effect sensor 14 generates an output signal $V_2$ having a pulse width $R_2$ between points $Q_2$ and $P_2$.

The pulse width $R_2$ of output signal $V_2$ when the ignition coil 9 is conducting is somewhat longer than the pulse width $R_0$ of output signal $V_0$ when the ignition coil 9 is not conducting. This difference in pulse width will somewhat adversely affect the engine timing, but the effect is relatively minor, and there is no possibility of the Hall-effect sensor 14 missing an output pulse as there is in a conventional signal generator. Therefore, a signal generator according to the present invention is extremely reliable, and the engine controller can always properly control the engine timing based on the output signal of the Hall-effect sensors 14.

The difference in the pulse widths $R_2$ and $R_0$ of the output signals of each Hall-effect sensor 14 can be decreased by the first and second magnetic by-passes 17 and 18, which guide the leakage flux from the ignition coil 9 so that it will by-pass the Hall-effect sensors 14 and not affect their operation. The less leakage flux there is that acts on the Hall-effect sensors 14, the smaller will be the difference in the pulse width $R_2$ when the ignition coil 9 is conducting and the pulse width $R_0$ when the ignition coil 9 is not conducting, and the more accurately can the engine timing be controlled.

What is claimed is:

1. A signal generator comprising:
   a Hall element;
   a magnet which is separated from the Hall element by a gap and which generates a magnetic field which acts on the Hall element;
   a distributor shaft;
   a magnetic vane which is secured to the distributor shaft and passes through the gap between the Hall element and the magnet when the distributor shaft is rotated; and
   an ignition coil which generates a magnetic field when current passes through the ignition coil, wherein the magnetic field which is generated by the ignition coil combines subtractively with the magnetic field generated by the magnet in the vicinity of the Hall element.

2. A signal generator as claimed in claim 1, further comprising a magnetic by-pass which is disposed so as to cause leakage flux from the ignition coil to by-pass the Hall element.

3. A signal generator as claimed in claim 1, wherein the ignition coil surrounds the distributor shaft.

4. A signal generator as claimed in claim 1, further comprising a signal processing circuit for generating a digital signal based on the output voltage of the Hall element.

5. A signal generator disposed in a housing of a distributor, the housing containing a rotatable distributor shaft and an ignition coil which generates a magnetic field when current passes through the ignition coil, the signal generator comprising:
   a Hall element which is disposed inside the housing;
   a magnet which is disposed inside the housing and separated from the Hall element by a gap, the magnet generating a magnetic field which acts on the Hall element, the direction of the magnetic field generated by the magnet being substantially opposite to the direction of the magnetic field generated by the ignition coil in the vicinity of the Hall element when the ignition coil is conducting;
   a vane assembly which is secured to the distributor shaft and has a plurality of vanes which pass through the gap between the Hall element and the magnet when the distributor shaft is rotated; and
   a magnetic by-pass which is disposed inside the housing in a position so as to cause leakage flux from the ignition coil to by-pass the Hall element.

* * * * *